(12) United States Patent
Wang et al.

(10) Patent No.: US 12,322,896 B2
(45) Date of Patent: Jun. 3, 2025

(54) ELECTRONIC EQUIPMENT

(71) Applicant: Chicony Electronics Co., Ltd., New Taipei (TW)

(72) Inventors: Kuan-Wen Wang, New Taipei (TW); Pei-Sheng Tsai, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 419 days.

(21) Appl. No.: 18/069,945

(22) Filed: Dec. 21, 2022

(65) Prior Publication Data

US 2024/0030649 A1 Jan. 25, 2024

(30) Foreign Application Priority Data

Jul. 20, 2022 (TW) ................................. 111127276

(51) Int. Cl.
*H01R 13/52* (2006.01)
*H01R 13/627* (2006.01)

(52) U.S. Cl.
CPC ..... *H01R 13/5219* (2013.01); *H01R 13/6272* (2013.01)

(58) Field of Classification Search
CPC ............ H01R 13/5219; H01R 13/5202; H01R 13/6272
USPC .......................... 439/272, 271, 548, 556, 559
See application file for complete search history.

(56) References Cited

U.S. PATENT DOCUMENTS

| | | | | |
|---|---|---|---|---|
| 3,753,212 A * | 8/1973 | Yamada | ............... | H01R 13/514 439/559 |
| 4,277,135 A * | 7/1981 | Schrott | ............... | G02B 6/3885 385/59 |
| 4,767,350 A * | 8/1988 | Cooper | ............... | H01R 12/716 439/748 |
| 2015/0070857 A1* | 3/2015 | Lin | ........................ | H01R 24/58 361/752 |
| 2016/0093974 A1* | 3/2016 | Lai | ....................... | H01R 13/521 439/736 |

FOREIGN PATENT DOCUMENTS

| | | |
|---|---|---|
| CN | 110380261 A | 10/2019 |
| CN | 215989578 U | 3/2022 |

* cited by examiner

*Primary Examiner* — Gary F Paumen
(74) *Attorney, Agent, or Firm* — CKC & Partners Co., LLC

(57) ABSTRACT

An electronic equipment includes a device and a cable. The device includes a casing, a fixing element, a sealing element, an electronic element and a first connecting portion. The fixing element is disposed inside the casing and includes a first snapping portion. The sealing element is sandwiched between the casing and the fixing element. The first connecting portion connects the electronic element located inside the casing. The cable includes a second connecting portion, a wiring portion and a body connected between the second connecting portion and the wiring portion. The body penetrates through an opening of the casing and an opening of the sealing element. The body has a second snapping portion and a pressing zone. When the second snapping portion snaps with the first snapping portion, the second connecting portion connects the first connecting portion, and the sealing element presses against the pressing zone.

12 Claims, 6 Drawing Sheets

ELECTRONIC EQUIPMENT

RELATED APPLICATIONS

This application claims priority to Taiwanese Application Serial Number 111127276 filed Jul. 20, 2022, which is herein incorporated by reference.

BACKGROUND

Technical Field

The present disclosure relates to electronic equipment. More particularly, the present disclosure relates to waterproof electronic equipment suitable for outdoor use.

Description of Related Art

Some electronic equipment for outdoor use often requires a connection with power supply for a long period of time, in order to guarantee the maintenance of status of normal operation of the electronic equipment. However, due to the exposure to outdoor environment, there may be risk that rainwater or dew can flow into the electronic equipment. If function of water-proofing is equipped to the electronic equipment at high cost, the overall cost of operation of the electronic equipment will be inevitably increased, which will weaken the market competitiveness of the electronic equipment.

Therefore, the way to improve the effect of water-proofing of the electronic equipment at low cost is undoubtedly an important issue that the industry highly concerns.

SUMMARY

A technical aspect of the present disclosure is to provide an electronic equipment, which can achieve the effect of water-proofing when electricity is supplied to or data is transmitted with the electronic device through the cable.

According to an embodiment of the present disclosure, an electronic equipment includes an electronic device and a cable. The electronic device includes a casing, a fixing element, a sealing element, an electronic element and a first connecting portion. The casing has a first opening. The fixing element is disposed inside the casing. The fixing element includes at least one first snapping portion. The sealing element is sandwiched between the casing and the fixing element. The sealing element has a second opening. The second opening is aligned with the first opening. The electronic element is located inside the casing. The first connecting portion is electrically connected with the electronic element. The cable includes a second connecting portion, a wiring portion and a main body. The second connecting portion is configured to electrically connect with the first connecting portion. The main body is connected between the second connecting portion and the wiring portion. The main body is configured to at least partially penetrate through the first opening and the second opening. The main body has a second snapping portion and a pressing zone. The second snapping portion is located between the pressing zone and the second connecting portion. The second snapping portion is configured to mutually snap with the first snapping portion. When the second snapping portion mutually snaps with the first snapping portion, the second connecting portion electrically connects with the first connecting portion, and the sealing element presses on the pressing zone to seal up between the sealing element and the pressing zone.

In one or more embodiments of the present disclosure, the first opening and the second opening are arranged along a first direction. The first snapping portion and the sealing element are separated from each other by a first distance along the first direction. The main body and the second connecting portion are arranged along a second direction. The second snapping portion and the pressing zone are separated from each other by a second distance along the second direction. The second distance is equal to the first distance.

In one or more embodiments of the present disclosure, the sealing element includes an annular portion and at least one protruding portion. The annular portion is at least partially sandwiched between the casing and the fixing element. The protruding portion is connected to an inner side of the annular portion. The protruding portion completely surrounds to define the second opening.

In one or more embodiments of the present disclosure, the electronic device further includes a positioning portion. The positioning portion is disposed inside the casing. The positioning portion surrounds the first opening. The annular portion further includes a first subsidiary annular portion and a second subsidiary annular portion. The first subsidiary annular portion is configured to be at least partially sandwiched the fixing element and the positioning portion. The protruding portion is connected to an inner side of the first subsidiary annular portion. The second subsidiary annular portion is connected with the first subsidiary annular portion. The second subsidiary annular portion forms a stepped shape together with the first subsidiary annular portion. The second subsidiary annular portion is configured to abut against the casing and the positioning portion.

In one or more embodiments of the present disclosure, the pressing zone is a smooth surface which completely surrounds the main body.

In one or more embodiments of the present disclosure, the main body and the second connecting portion are arranged along a direction. A cross-sectional area of the main body perpendicular to the direction at the pressing zone has an outer edge. A profile of the outer edge matches with a profile of the second opening.

In one or more embodiments of the present disclosure, a quantity of the first snapping portion is plural.

In one or more embodiments of the present disclosure, the fixing element includes a first subsidiary fixing element and a second subsidiary fixing element. The first subsidiary fixing element is configured to connect with the casing. The sealing element is sandwiched between the first subsidiary fixing element and the casing. The first subsidiary fixing element has a third opening. The third opening is configured to allow the main body to penetrate through. The second subsidiary fixing element is connected with a side of the first subsidiary fixing element away from the casing. The second subsidiary fixing element is configured to abut against the main body. The second subsidiary fixing element has a fourth opening. The fourth opening is configured to allow the second connecting portion to penetrate through. The first snapping portion is connected with the second subsidiary fixing element.

In one or more embodiments of the present disclosure, the first subsidiary fixing element is detachably connected with the casing.

In one or more embodiments of the present disclosure, the first snapping portion, the first subsidiary fixing element and the second subsidiary fixing element are integrally formed.

In one or more embodiments of the present disclosure, the second connecting portion is a universal serial bus (USB) plug, and the first connecting portion is a USB socket.

In one or more embodiments of the present disclosure, the first snapping portion is at least partially shaped as a hook, and the second snapping portion is a groove.

The above-mentioned embodiments of the present disclosure have at least the following advantages:

(1) When a user connects the cable to the electronic device, the second snapping portion of the main body mutually snaps with the first snapping portion of the fixing element, in order to prevent the cable from being detached from the electronic device. Moreover, through the feeling to the fingers of the user at the moment the second snapping portion is mutually snapped with the first snapping portion, the user can simply and easily know that the second connecting portion of the cable is already connected with the first connecting portion of the electronic device, while the sealing element also presses right on the pressing zone of the main body, which is convenient to the user.

(2) When the protruding portion of the sealing element presses on the pressing zone of the main body, the protruding portion is compressed and elastically deformed, and the pressing zone of the main body is a smooth surface which completely surrounds the main body. Therefore, when the protruding portion of the sealing element presses on the pressing zone, a better sealing effect between the sealing element and the main body can be achieved.

(3) When an user installs the sealing element relative to the casing, since the second subsidiary annular portion of the sealing element abuts against the positioning portion, the positioning portion can provide the sealing element with the function of positioning, facilitating the installation of the sealing element.

(4) Since the cross-sectional area of the main body perpendicular to the second direction at the pressing zone has an outer edge, and the profile of the outer edge matches with the profile of the second opening defined by the protruding portion, a better sealing effect between the sealing element and the pressing zone of the main body can be achieved.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
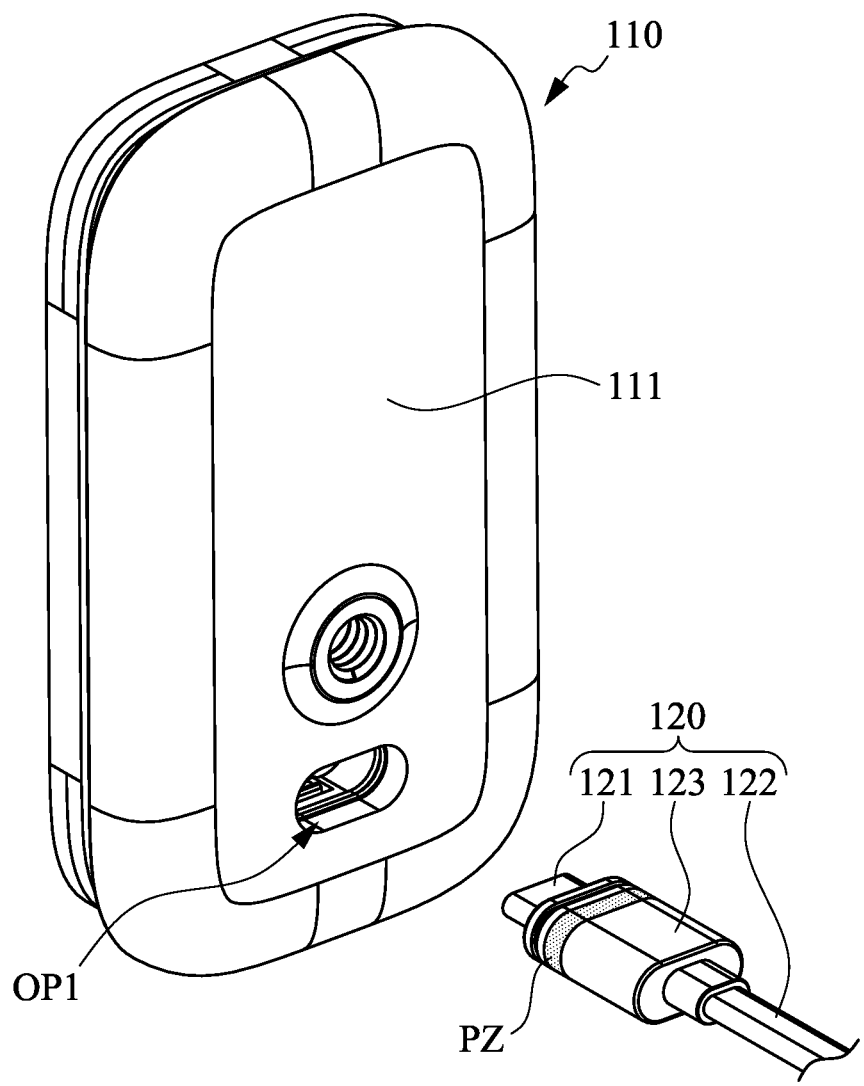
FIG. 1 is a schematic view of an electronic equipment according to an embodiment of the present disclosure, in which the cable is not yet connected to the electronic device.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
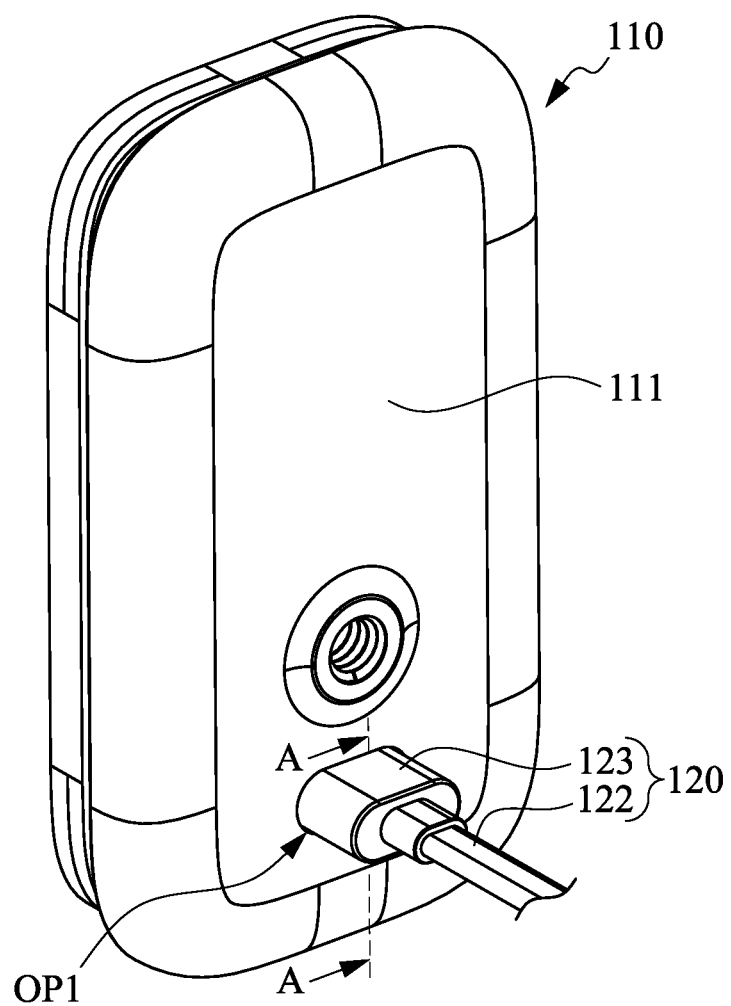
FIG. 2 is a schematic view of the electronic equipment of FIG. 1, in which the cable is already connected to the electronic device.

Reference is made to FIGS. 1-2. FIG. 1 is a schematic view of an electronic equipment 100 according to an embodiment of the present disclosure, in which the cable 120 is not yet connected to the electronic device 110. FIG. 2 is a schematic view of the electronic equipment 100 of FIG. 1, in which the cable 120 is already connected to the electronic device 110. In this embodiment, as shown in FIGS. 1-2, an electronic equipment 100 includes an electronic device 110 and a cable 120. The electronic device 110 can be an electronic device used in outdoor environment, such as a monitor. To be specific, the electronic device 110 includes a casing 111. The casing 111 has a first opening OP1. One end of the cable 120 is connected to a power supply (not shown) or a data storage device (not shown), while the other end of the cable 120 is configured to penetrate through the first opening OP1 of the casing 111 and electrically connect with the electronic device 110, so as to continuously supply electricity to the electronic device 110 or carry out transmission of data with the electronic device 110.

Figure 3:
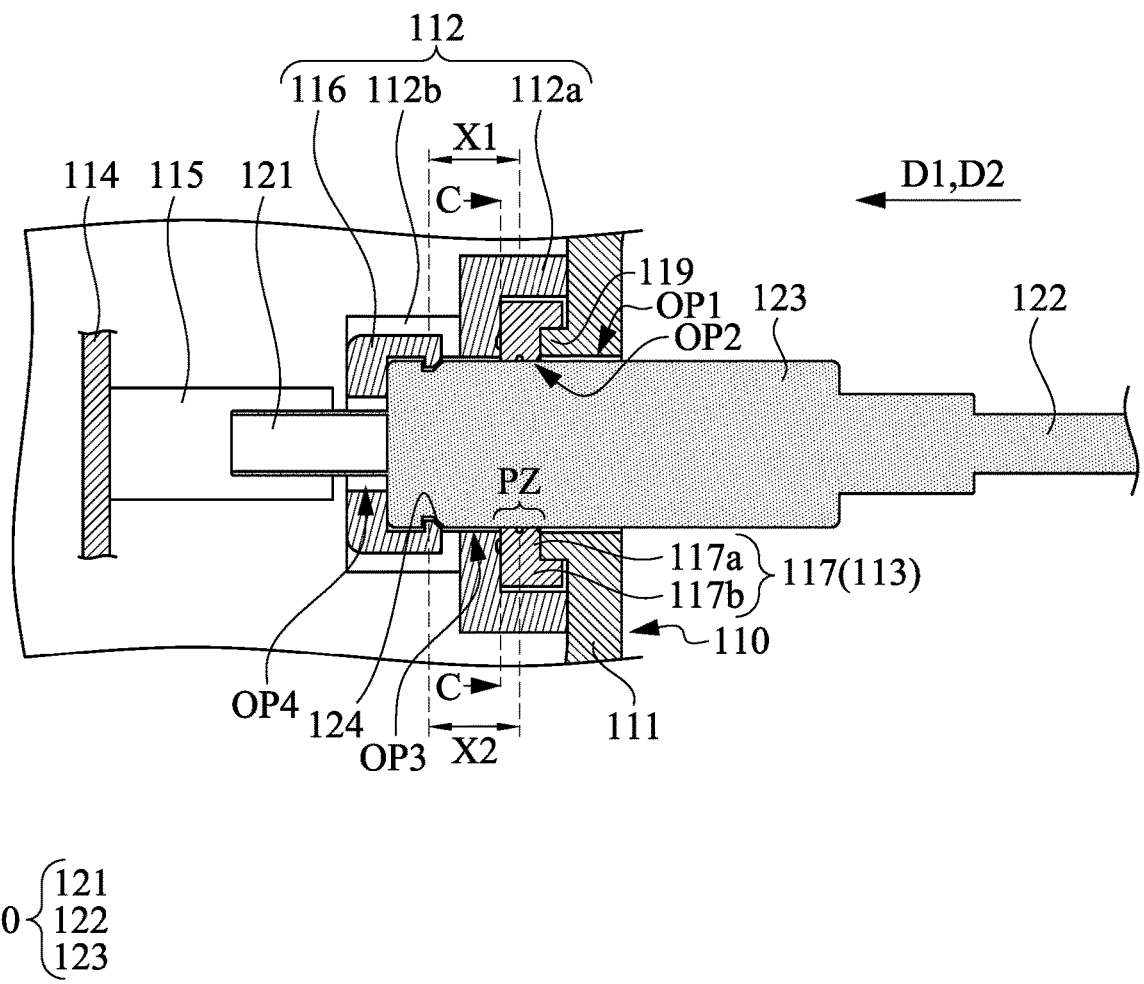
FIG. 3 is a partially enlarged cross-sectional view along the section line A-A of FIG. 2.
Figure 4:
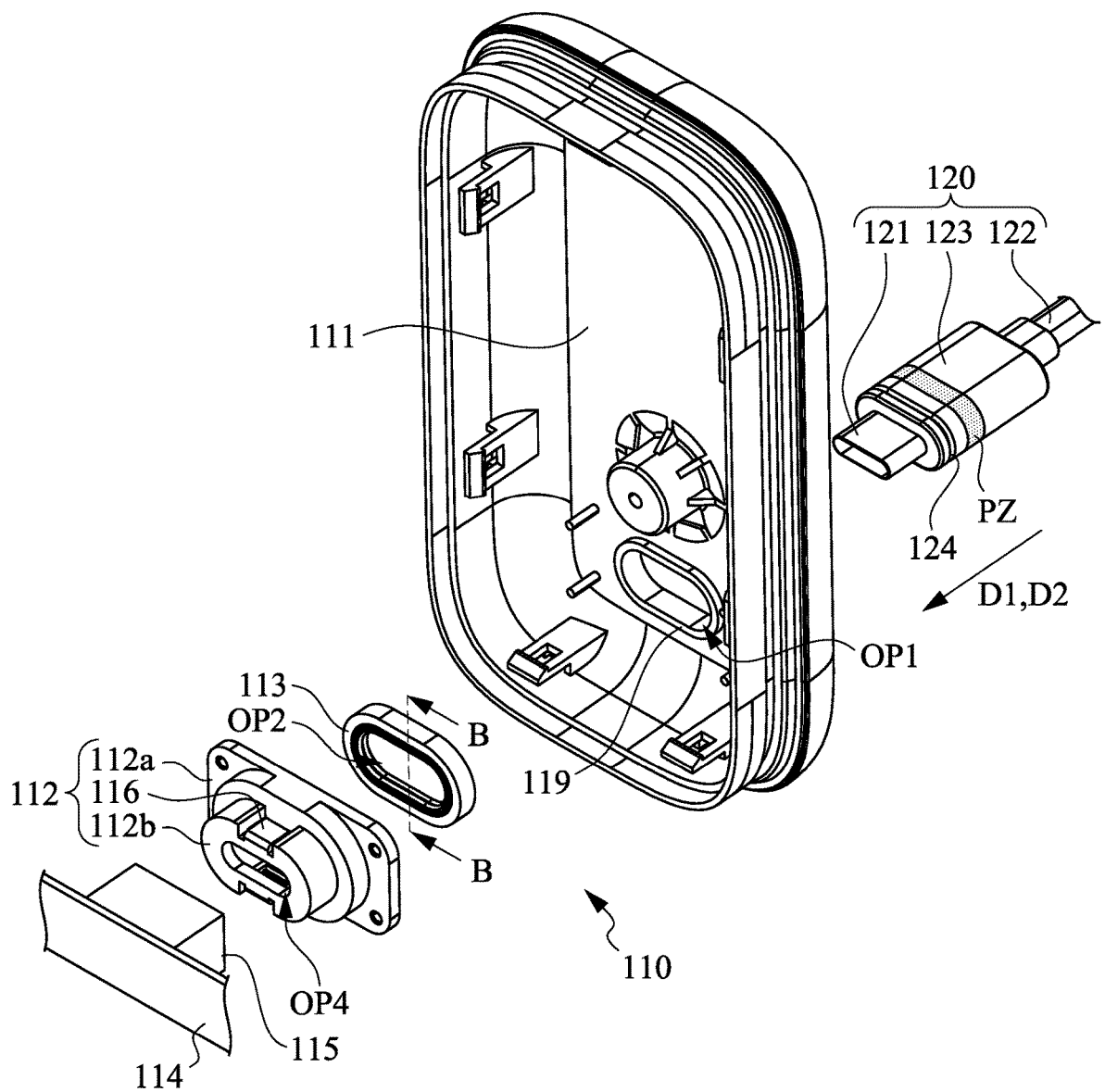
FIG. 4 is an exploded view of the electronic equipment of FIG. 1.

Reference is made to FIGS. 3-4. FIG. 3 is a partially enlarged cross-sectional view along the section line A-A of FIG. 2. FIG. 4 is an exploded view of the electronic equipment 100 of FIG. 1. To be specific, as shown in FIGS. 3-4, the electronic device 110 includes a fixing element 112, a sealing element 113, an electronic element 114 and a first connecting portion 115. The fixing element 112 is disposed inside the casing 111. The fixing element 112 includes at least one first snapping portion 116. The sealing element 113 is sandwiched between the casing 111 and the fixing element 112. Thus, the sealing element 113 can be fixed relative to the casing 111. Moreover, the sealing element 113 has a second opening OP2. The second opening OP2 and the first opening OP1 of the casing 111 are arranged along a first direction D1, and the second opening OP2 is aligned with the first opening OP1. In addition, the electronic element 114 is located inside the casing 111. The first connecting portion 115 is electrically connected with the electronic element 114.

On the other hand, as shown in FIGS. 1-4, the cable 120 includes a second connecting portion 121, a wiring portion 122 and a main body 123. The second connecting portion 121 of the cable 120 is configured to electrically connect with the first connecting portion 115 of the electronic device 110, so as to continuously supply electricity to the electronic device 110 or carry out transmission of data with the electronic device 110. In practical applications, the second connecting portion 121 is a universal serial bus (USB) plug, and the first connecting portion 115 is a USB socket. The main body 123 of the cable 120 is connected between the second connecting portion 121 and the wiring portion 122. The main body 123 is configured to at least partially penetrate through the first opening OP1 of the casing 111 and the second opening OP2 of the sealing element 113. Furthermore, the main body 123 has a second snapping portion 124 and a pressing zone PZ. The second snapping portion 124 is located between the pressing zone PZ and the second connecting portion 121. The second snapping portion 124 is configured to mutually snap with the first snapping portion 116, in order to prevent the cable 120 from being detached from the electronic device 110. In practical applications, the first snapping portion 116 is at least partially shaped as a hook, and the second snapping portion 124 is a groove. The first snapping portion 116 at least partially shaped as a hook is suitable to snap with the second snapping portion 124 as a groove.

It is worth to note that, in this embodiment, when the second snapping portion 124 of the main body 123 mutually snaps with the first snapping portion 116 of the fixing element 112, the second connecting portion 121 of the cable 120 is electrically connected with the first connecting portion 115 of the electronic device 110, and the sealing element 113 presses on the pressing zone PZ of the main body 123 to seal up between the sealing element 113 and the pressing zone PZ. Under the condition that the sealing element 113 presses on the pressing zone PZ of the main body 123 to seal up between the sealing element 113 and the pressing zone PZ, when the second connecting portion 121 of the cable 120 is electrically connected with the first connecting portion 115 of the electronic device 110, i.e., when electricity is supplied to or data is transmitted with the electronic device 110 through the cable 120, water surrounding the electronic equipment 100, such as rainwater or dew, will be uneasy to flow into the electronic equipment 100 through the space between the sealing element 113 and the pressing zone PZ of the main body 123. In this way, the electronic equipment 100 is suitable to be used in outdoor environment.

In addition, when a user connects the cable 120 to the electronic device 110, through the feeling to the fingers of the user at the moment the second snapping portion 124 of the main body 123 is mutually snapped with the first snapping portion 116 of the fixing element 112, the user can simply and easily know that the second connecting portion 121 of the cable 120 is already connected with the first connecting portion 115 of the electronic device 110, while the sealing element 113 also presses right on the pressing zone PZ of the main body 123, which is convenient to the user.

To be more specific, as shown in FIG. 3, the first snapping portion 116 and the sealing element 113 are separated from each other by a first distance X1 along the first direction D1. On the other hand, the main body 123 and the second connecting portion 121 are arranged along a second direction D2. The second snapping portion 124 and the pressing zone PZ are separated from each other by a second distance X2 along the second direction D2. In this embodiment, the second distance X2 is equal to the first distance X1. Therefore, when the second connecting portion 121 of the cable 120 is electrically connected with the first connecting portion 115 of the electronic device 110, the sealing element 113 presses right on the pressing zone PZ of the main body 123. In practice, when the second connecting portion 121 of the cable 120 is electrically connected with the first connecting portion 115 of the electronic device 110, the first direction D1 is the same as the second direction D2.

Figure 5:
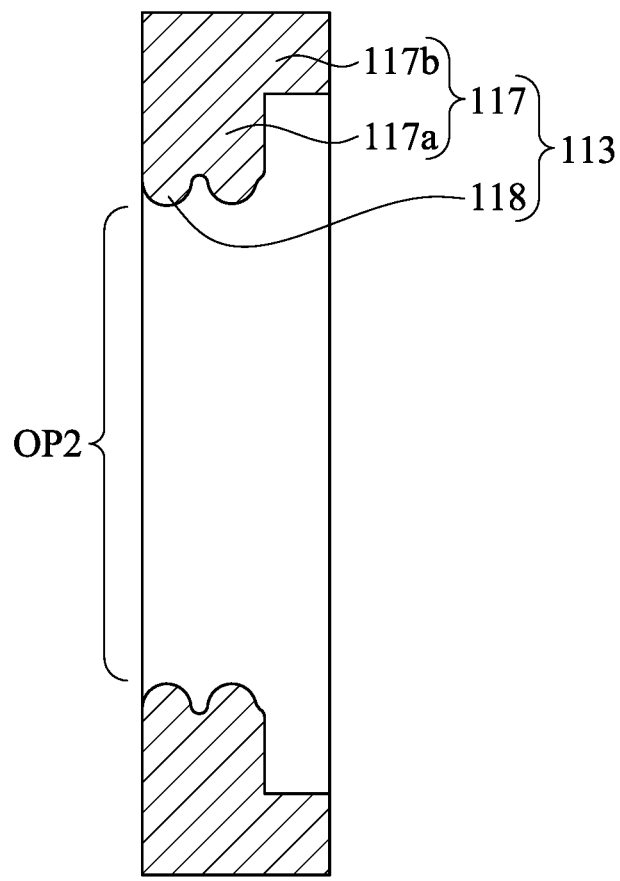
FIG. 5 is a partially enlarged cross-sectional view along the section line B-B of FIG. 4.

Reference is made to FIG. 5. FIG. 5 is a partially enlarged cross-sectional view along the section line B-B of FIG. 4. In this embodiment, as shown in FIG. 5, the sealing element 113 includes an annular portion 117 and at least one protruding portion 118. Furthermore, the annular portion 117 further includes a first subsidiary annular portion 117a and a second subsidiary annular portion 117b. The second subsidiary annular portion 117b is connected with the first subsidiary annular portion 117a. The second subsidiary annular portion 117b forms a stepped shape together with the first subsidiary annular portion 117a. The protruding portion 118 is connected to an inner side of the first subsidiary annular portion 117a. The protruding portion 118 completely surrounds to define the second opening OP2. In practical applications, the first subsidiary annular portion 117a, the second subsidiary annular portion 117b and the protruding portion 118 can be integrally formed. In this embodiment, the sealing element 113 can be made of elastic material, such as rubber, which is capable of isolating moisture. The protruding portion 118 of the sealing element 113 is configured to press on the pressing zone PZ of the main body 123. When the protruding portion 118 presses on the pressing zone PZ, as shown in FIG. 3, the protruding portion 118 is compressed and elastically deformed, such that the degree of sealing between the sealing element 113 and the pressing zone PZ of the main body 123 is increased. According to actual situations, the quantity of the protruding portion 118 can be plural. For example, as shown in FIG. 5, the quantity of the protruding portion 118 is two. However, this does not intend to limit the present disclosure. Moreover, these two protruding portion 118s are separated from each other by a certain distance and are parallel with each other, which further effectively increases the degree of sealing.

Moreover, in practical applications, the pressing zone PZ of the main body 123 is a smooth surface which completely surrounds the main body 123. In this way, when the protruding portion 118 of the sealing element 113 presses on the pressing zone PZ, a better sealing effect between the sealing element 113 and the main body 123 can be achieved.

Furthermore, as shown in FIGS. 3-4, the electronic device 110 further includes a positioning portion 119. The positioning portion 119 is disposed inside the casing 111. The positioning portion 119 surrounds the first opening OP1. In practical applications, the positioning portion 119 can also be a flange structure formed from an inward extension of the casing 111. As shown in FIG. 3, the first subsidiary annular portion 117a is configured to be at least partially sandwiched the fixing element 112 and the positioning portion 119. The second subsidiary annular portion 117b is configured to abut against the casing 111 and the positioning portion 119. When an user installs the sealing element 113 relative to the casing 111, since the second subsidiary annular portion 117b of the sealing element 113 abuts against the positioning portion 119, the positioning portion 119 can provide the sealing element 113 with the function of positioning, facilitating the installation of the sealing element 113.

Figure 6:
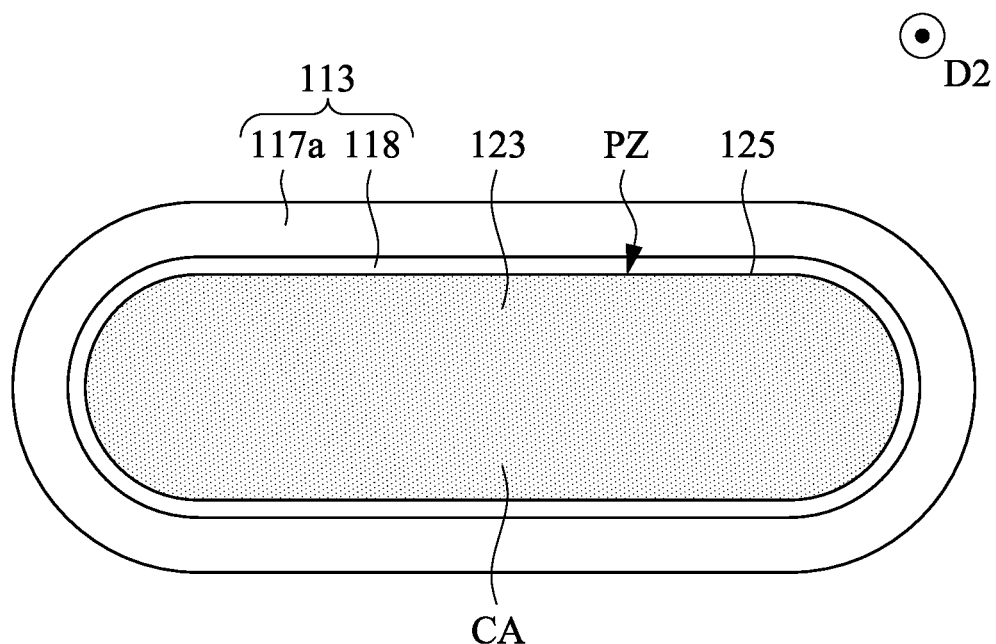
FIG. 6 is a partially enlarged cross-sectional view along the section line C-C of FIG. 3.

Reference is made to FIG. 6. FIG. 6 is a partially enlarged cross-sectional view along the section line C-C of FIG. 3. FIG. 6 is also a view showing the cross-sectional area CA of the main body 123 perpendicular to the second direction D2 at the pressing zone PZ. In this embodiment, as shown in FIG. 6, the cross-sectional area CA of the main body 123 perpendicular to the second direction D2 at the pressing zone PZ has an outer edge 125, and the profile of the outer edge 125 matches with the profile of the second opening OP2 defined by the protruding portion 118. Therefore, a better sealing effect between the sealing element 113 and the pressing zone PZ of the main body 123 can be achieved.

Please go back to FIGS. 3-4. In this embodiment, as shown in FIGS. 3-4, the fixing element 112 includes a first subsidiary fixing element 112a and a second subsidiary fixing element 112b. The first snapping portion 116 is connected with the second subsidiary fixing element 112b. In practical applications, the first snapping portion 116, the first subsidiary fixing element 112a and the second subsidiary fixing element 112b are integrally formed, which facilitates the fixing element 112 to connect with the casing 111. To be more specific, the first subsidiary fixing element 112a is configured to connect with the casing 111. The sealing element 113 is sandwiched between the first subsidiary fixing element 112a and the casing 111. The first subsidiary fixing element 112a has a third opening OP3. The third opening OP3 is configured to allow the main body 123 of the cable 120 to penetrate through. The second subsidiary fixing element 112b is connected with a side of the first subsidiary fixing element 112a away from the casing 111. The second subsidiary fixing element 112b is configured to abut against the main body 123 of the cable 120, so as to provide a function of positional restriction when the cable 120 is inserted into the electronic device 110. Moreover, the second subsidiary fixing element 112b has a fourth opening OP4. The fourth opening OP4 is configured to allow the second connecting portion 121 of the cable 120 to penetrate through.

According to actual situations, the quantity of the first snapping portion 116 can be plural. For example, as shown in FIGS. 3-4, the quantity of the first snapping portion 116 is two. The two first snapping portions 116 are symmetrically connected to two opposite sides of the second subsidiary fixing element 112b, such that the second snapping portion 124 of the main body 123 can be snapped between the two first snapping portions 116.

In practical applications, the first subsidiary fixing element 112a can be fixed on the casing 111 by, for example, thermal melting. On the other hand, the first subsidiary fixing element 112a can be detachably connected to the casing 111 by, for example, connection of screws. However, this does not intend to limit the present disclosure.

In conclusion, the aforementioned embodiments of the present disclosure have at least the following advantages:

(1) When a user connects the cable to the electronic device, the second snapping portion of the main body mutually snaps with the first snapping portion of the fixing element, in order to prevent the cable from being detached from the electronic device. Moreover, through the feeling to the fingers of the user at the moment the second snapping portion is mutually snapped with the first snapping portion, the user can simply and easily know that the second connecting portion of the cable is already connected with the first connecting portion of the electronic device, while the sealing element also presses right on the pressing zone of the main body, which is convenient to the user.

(2) When the protruding portion of the sealing element presses on the pressing zone of the main body, the protruding portion is compressed and elastically deformed, and the pressing zone of the main body is a smooth surface which completely surrounds the main body. Therefore, when the protruding portion of the sealing element presses on the pressing zone, a better sealing effect between the sealing element and the main body can be achieved.

(3) When an user installs the sealing element relative to the casing, since the second subsidiary annular portion of the sealing element abuts against the positioning portion, the positioning portion can provide the sealing element with the function of positioning, facilitating the installation of the sealing element.

(4) Since the cross-sectional area of the main body perpendicular to the second direction at the pressing zone has an outer edge, and the profile of the outer edge matches with the profile of the second opening defined by the protruding portion, a better sealing effect between the sealing element and the pressing zone of the main body can be achieved.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An electronic equipment, comprising:
   an electronic device, comprising:
      a casing having a first opening;
      a fixing element disposed inside the casing and comprising at least one first snapping portion;
      a sealing element sandwiched between the casing and the fixing element, the sealing element having a second opening aligned with the first opening;
      an electronic element located inside the casing; and
      a first connecting portion electrically connected with the electronic element; and
   a cable, comprising:
      a second connecting portion configured to electrically connect with the first connecting portion;
      a wiring portion; and
      a main body connected between the second connecting portion and the wiring portion, the main body being configured to at least partially penetrate through the first opening and the second opening, the main body having a second snapping portion and a pressing zone, the second snapping portion being located between the pressing zone and the second connecting portion, the second snapping portion being configured to mutually snap with the first snapping portion,
   wherein when the second snapping portion mutually snaps with the first snapping portion, the second connecting portion electrically connects with the first connecting portion, and the sealing element presses on the pressing zone to seal up between the sealing element and the pressing zone.

2. The electronic equipment of claim 1, wherein the first opening and the second opening are arranged along a first direction, the first snapping portion and the sealing element are separated from each other by a first distance along the first direction, the main body and the second connecting portion are arranged along a second direction, the second snapping portion and the pressing zone are separated from each other by a second distance along the second direction, the second distance is equal to the first distance.

3. The electronic equipment of claim 1, wherein the sealing element comprises:

an annular portion at least partially sandwiched between the casing and the fixing element; and at least one protruding portion connected to an inner side of the annular portion and completely surrounding to define the second opening.

4. The electronic equipment of claim 3, wherein the electronic device further comprises a positioning portion disposed inside the casing and surrounding the first opening, the annular portion further comprises:

a first subsidiary annular portion configured to be at least partially sandwiched the fixing element and the positioning portion, the protruding portion is connected to an inner side of the first subsidiary annular portion; and a second subsidiary annular portion connected with the first subsidiary annular portion and forming a stepped shape together with the first subsidiary annular portion, the second subsidiary annular portion is configured to abut against the casing and the positioning portion.

5. The electronic equipment of claim 1, wherein the pressing zone is a smooth surface completely surrounding the main body.

6. The electronic equipment of claim 1, wherein the main body and the second connecting portion are arranged along a direction, a cross-sectional area of the main body perpendicular to the direction at the pressing zone has an outer edge, a profile of the outer edge matches with a profile of the second opening.

7. The electronic equipment of claim 1, wherein a quantity of the first snapping portion is plural.

8. The electronic equipment of claim 1, wherein the fixing element comprises:

a first subsidiary fixing element configured to connect with the casing, the sealing element is sandwiched between the first subsidiary fixing element and the casing, the first subsidiary fixing element has a third opening, the third opening is configured to allow the main body to penetrate through; and a second subsidiary fixing element connected with a side of the first subsidiary fixing element away from the casing, the second subsidiary fixing element is configured to abut against the main body, the second subsidiary fixing element has a fourth opening, the fourth opening is configured to allow the second connecting portion to penetrate through, the first snapping portion is connected with the second subsidiary fixing element.

9. The electronic equipment of claim 8, wherein the first subsidiary fixing element is detachably connected with the casing.

10. The electronic equipment of claim 8, wherein the first snapping portion, the first subsidiary fixing element and the second subsidiary fixing element are integrally formed.

11. The electronic equipment of claim 1, wherein the second connecting portion is a universal serial bus (USB) plug, the first connecting portion is a USB socket.

12. The electronic equipment of claim 1, wherein the first snapping portion is at least partially shaped as a hook, the second snapping portion is a groove.

* * * * *